(12) United States Patent
Tuttle

(10) Patent No.: US 9,153,614 B2
(45) Date of Patent: Oct. 6, 2015

(54) METHOD AND APPARATUS FOR LENS ALIGNMENT FOR OPTICALLY SENSITIVE DEVICES AND SYSTEMS IMPLEMENTING SAME

(75) Inventor: Mark E. Tuttle, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 2160 days.

(21) Appl. No.: 11/839,377

(22) Filed: Aug. 15, 2007

(65) Prior Publication Data

US 2009/0046144 A1 Feb. 19, 2009

(51) Int. Cl.
*H04N 5/225* (2006.01)
*H01L 27/146* (2006.01)
*G02B 3/00* (2006.01)

(52) U.S. Cl.
CPC .... *H01L 27/14627* (2013.01); *H01L 27/14685* (2013.01); *G02B 3/0056* (2013.01)

(58) Field of Classification Search
USPC ........ 257/81, 99, 433–436, 680, 684, E27.13, 257/E27.133, E27.15; 438/57, 69, 60, 64, 438/65; 359/215.1, 244, 362, 440, 642, 359/738, 819; 348/374, 335, 340, 345, 294, 348/298, 308, 360
See application file for complete search history.

(56) References Cited

U.S. PATENT DOCUMENTS

| | | | |
|---|---|---|---|
| 5,536,455 A | 7/1996 | Aoyama et al. | |
| 6,734,419 B1 * | 5/2004 | Glenn et al. | 250/239 |
| 6,979,902 B2 | 12/2005 | Kinsman | |
| 7,005,627 B2 | 2/2006 | Lim | |
| 7,227,692 B2 | 6/2007 | Li et al. | |
| 2002/0154239 A1 * | 10/2002 | Fujimoto et al. | 348/340 |
| 2005/0078377 A1 | 4/2005 | Li et al. | |
| 2005/0226608 A1 * | 10/2005 | Kwon et al. | 396/91 |
| 2005/0231626 A1 | 10/2005 | Tuttle et al. | |
| 2006/0038112 A1 | 2/2006 | Jiang et al. | |
| 2006/0049154 A1 * | 3/2006 | Clifford et al. | 219/121.64 |
| 2006/0152601 A1 | 7/2006 | Parekh | |
| 2006/0170810 A1 | 8/2006 | Kim | |

(Continued)

FOREIGN PATENT DOCUMENTS

JP 9307697 A 11/1997
JP 2004311594 A 4/2004

(Continued)

OTHER PUBLICATIONS

Berthold, A., et al., "Low temperature wafer-to-wafer bonding for MEMS applications," Proc. RISC/IEEE, 31-33, 1998 (ISBN 90-73461-15-4).

(Continued)

*Primary Examiner* — Meiya Li
(74) *Attorney, Agent, or Firm* — TraskBritt

(57) ABSTRACT

Non-symmetrically located lenses are employed with semiconductor devices comprising optically active regions which are non-symmetrically located on a surface thereof. The optical axes of the lenses are aligned with the centers of the optically active regions. Wafer-level assemblies of semiconductor devices and lenses may be fabricated, mutually secured with the non-symmetrically placed lenses aligned over the non-symmetrically placed optically active regions, and singulated to form packages, such as image sensor packages. Related methods, and systems incorporating devices with non-symmetrically placed optically active regions and aligned lenses are also disclosed.

29 Claims, 4 Drawing Sheets

(56) References Cited

U.S. PATENT DOCUMENTS

| | | |
|---|---|---|
| 2006/0183266 A1 | 8/2006 | Han |
| 2006/0186492 A1 | 8/2006 | Boettiger et al. |
| 2006/0187554 A1 | 8/2006 | Boettiger et al. |
| 2006/0261427 A1 | 11/2006 | Dillon et al. |
| 2006/0267121 A1 | 11/2006 | Li |

FOREIGN PATENT DOCUMENTS

| | | |
|---|---|---|
| JP | 2004302095 A | 10/2004 |
| JP | 200619918 A | 1/2006 |
| WO | 2006130517 A1 | 12/2006 |

OTHER PUBLICATIONS

Kastelan, David, "CMOS Image Sensor Development," pp. 1-15, (no date), http://www.ece.ualberta.ca/~kastelan/docs/cmos-imager.pdf.

Wang, Ching-Chun, "A Study of CMOS Technologies for Image Sensor Applications," Submitted to the Dept. of Electrical Eng. & Computer Science in partial fulfillment of the requirements for the degree of Doctor of Philosophy, Mass. Inst. Tech., pp. 1-196, Aug. 2001, http://www-mtl.mit.edu/researchgroups/sodini/ginger%20wangthesis.pdf.

U.S. Appl. No. 11/732,691, filed Apr. 4, 2007, entitled "Optic Wafer With Reliefs, Wafer Assembly Including Same and Methods of Dicing Wafer Assembly."

U.S. Appl. No. 11/751,206, filed May 21, 2007, entitled "Wafer Level Lens Arrays for Image Sensor Packages and the Like, Image Sensor Packages, and Related Methods."

PCT International Search Report for Application No. PCT/US2008/072179 dated Feb. 17, 2009 ,3 pages.

PCT Written Opinion of the International Searching Authority for Application No. PCT/US2008/072179, dated Feb. 17, 2009, 4 pages.

\* cited by examiner

METHOD AND APPARATUS FOR LENS ALIGNMENT FOR OPTICALLY SENSITIVE DEVICES AND SYSTEMS IMPLEMENTING SAME

TECHNICAL FIELD

Embodiments of the present invention relate to alignment of lenses for optically sensitive devices such as image sensors packages, wafer level structures for the fabrication thereof, and components and fabrication methods therefor. More particularly, embodiments of the invention pertain to alignment of one or more lenses with a non-symmetrically placed pixel array of an optically sensitive region of an image sensor.

BACKGROUND

Semiconductor die-based image sensors are well known to those having skill in the electronics/photonics art and, in a miniaturized configuration, are useful for capturing electromagnetic radiation (e.g., visual, IR or UV) information in digital cameras, personal digital assistants (PDA), internet appliances, cell phones, test equipment, and the like, for viewing, further processing or both. For commercial use in the aforementioned extremely competitive markets, image sensor packages must be very small. For some applications, a package of a size on the order of the semiconductor die or chip itself, or a so-called "chip-scale" package, is desirable if not a requirement.

While traditional semiconductor devices, such as processors and memory, are conventionally packaged in an opaque protective material, image sensors typically comprise a light wavelength frequency radiation-sensitive integrated circuit (also termed an "optically sensitive" circuit or region, or "imaging area") fabricated on the active surface of a semiconductor die and covered by an optically transmissive element, wherein the optically sensitive circuit of the image sensor is positioned to receive light radiation from an external source through the optically transmissive element. Thus, one surface of the image sensor package conventionally comprises a transparent portion, which usually is a lid of light-transmitting glass or plastic. For photographic or other purposes requiring high resolution, the chip is positioned to receive focused radiation from an optical lens associated therewith. The image sensor may be one of a charge-coupling device (CCD) or a complementary metal oxide semiconductor (CMOS). The optically sensitive circuit of each such sensor conventionally includes an array of pixels containing photo sensors in the form of photogates, phototransistors or photodiodes, commonly termed an "imager array."

When an image is focused on the imager array, light corresponding to the image is directed to the pixels. An imager array of pixels may include a micro-lens array that includes a convex micro-lens for each pixel. Each micro-lens may be used to direct incoming light through a circuitry region of the corresponding pixel to the photo sensor region, increasing the amount of light reaching the photo sensor and increasing the fill factor of the pixels. Micro-lenses may also be used to intensify illuminating light from pixels of a non-luminescent display device (such as a liquid crystal display device) to increase the brightness of the display, to form an image to be printed in a liquid crystal or light emitting diode printer, or even to provide focusing for coupling a luminescent device or receptive device to an optical fiber.

Various factors are considered in the design and manufacture of image sensor packages. For example, the extent to which a large number of packages can be at least partially, if not completely, fabricated simultaneously at the wafer level is a substantial cost consideration. Furthermore, if the package design or fabrication approach, even if conducted at the wafer level, necessitates that all of the image sensor semiconductor dice located thereon be packaged regardless of whether a significant number of the dice are defective, a substantial waste of materials results. Also, the package lenses must be carefully positioned relative to the optically sensitive circuit on each of the dice to achieve uniformly high quality imaging while precluding entry of moisture and other contaminants into the chamber defined between the optically sensitive circuitry and the lens.

One significant problem with conventional lens positioning techniques arises when an imaging area comprising a pixel array is located non-symmetrically on an image sensor die, whereas conventional lenses are configured so that the optical center of the lens is symmetrically, or centrally, positioned over the image sensor as a whole, and not over the pixel array. The non-symmetrical location of the pixel array is often dictated by integrated circuit design constraints imposed by locations of circuits, for example memory, and bond pads on the active surface of the image sensor die. In other words, as a result of the circuit designers' attempts to optimize the electrical aspects of an image sensor die, the pixel array becomes positioned off-center.

Thus, there remains a need for a packaging technique which accommodates symmetrical non-positioning of the imaging area on an image sensor, which technique may be effected at a wafer level and which provides high quality image sensor packages incorporating a non-symmetrical imaging area.

BRIEF DESCRIPTION OF THE SEVERAL VIEWS OF THE DRAWINGS

In the drawings, which depict embodiments of the present invention, and in which various elements are not necessarily to scale.

DETAILED DESCRIPTION

Figure 1A:
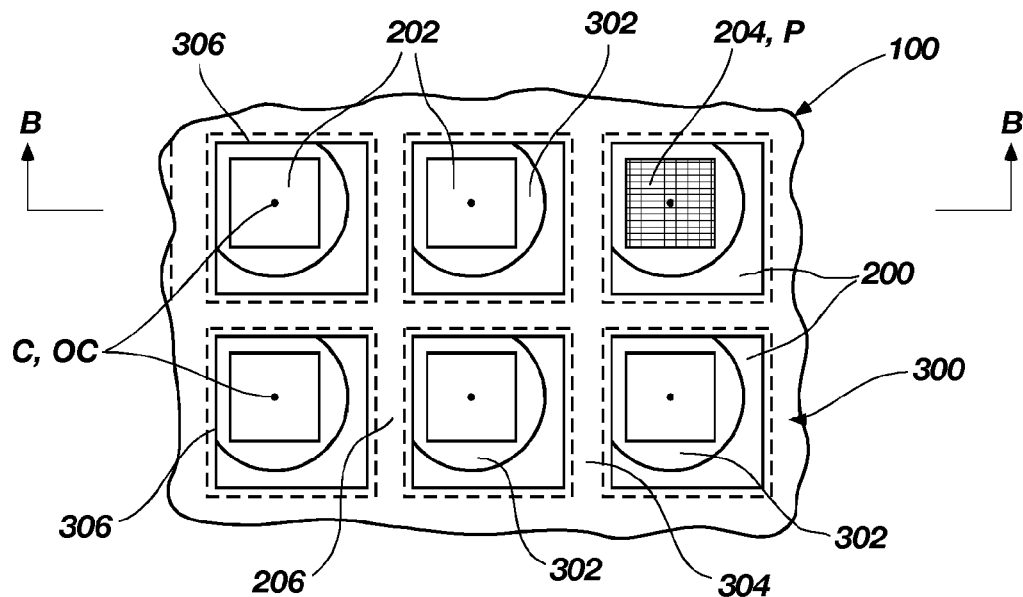
FIG. 1A is a schematic top elevation of a portion of an array of image sensors having non-symmetrically positioned imaging areas carried on a bulk semiconductor substrate, each imaging area having a lens non-symmetrically positioned thereover, according to an embodiment of the invention.

Referring in general to the accompanying drawings, various embodiments of the present invention are illustrated in the form of semiconductor package structures and methods for assembly of such package structures. Common elements of the illustrated embodiments are designated with like reference numerals. It should be understood that the figures presented are not meant to be illustrative of actual views of any particular portion of a particular semiconductor package structure, but are merely idealized schematic representations which are employed to more clearly and fully depict the invention.

The terms "upper," "lower," "top" and "bottom" are used for convenience only in this description of embodiments of the invention in conjunction with the orientations of features depicted in the drawing figures. However, these terms are used generally to denote opposing directions and positions, and not in reference to gravity. For example, an image sensor package according to embodiments of the present invention may, in practice, be oriented in any suitable direction during fabrication or use.

The various embodiments of the present invention relate to optically sensitive semiconductor devices, one type of such device being an image sensor. As used herein, the term "optically sensitive" is merely indicative that the device responds to impingement of visible or other wavelength or wavelengths of light thereon, and is not in any sense limiting of the nature of such device.

FIG. 1A depicts a portion of a bulk semiconductor substrate 100 having an array of image sensors 200 in the form of semiconductor dice, which may also be termed image sensor dice, fabricated thereon. Bulk semiconductor substrate 100 may comprise a conventional wafer of semiconductor material, for example a silicon, gallium arsenide or indium phosphide wafer, or may comprise a semiconductor material disposed on a carrier substrate, for example a silicon-on-insulator (SOI) substrate as exemplified by a silicon-on-glass (SOG) substrate or a silicon-on-sapphire (SOS) substrate. In any case, image sensors 200 of the array are fabricated thereon by techniques well known to those of ordinary skill in the art and which need not be further described herein.

Figure 1B:
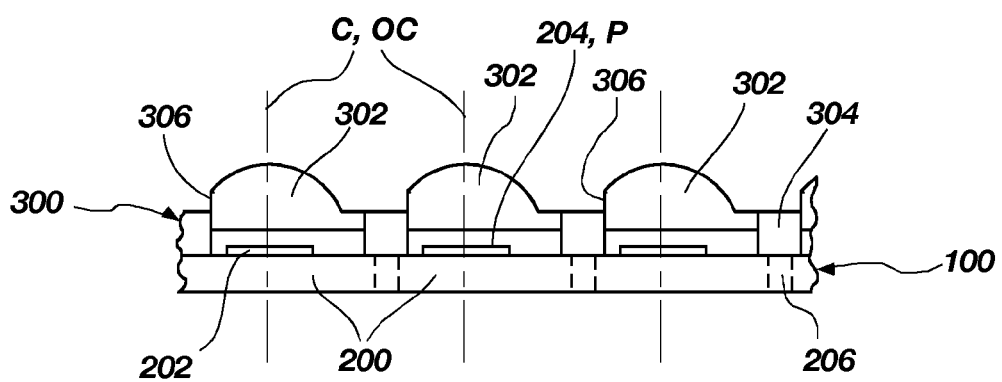
FIG. 1B is a schematic side sectional elevation along line B-B of FIG. 1A.

Each image sensor 200 includes an optically sensitive region thereon in the form of an imaging area 202 located on an active surface thereof, each imaging area 202 comprising an imager array 204 including a plurality of pixels P (shown on only one sensor 200 of FIG. 1A for clarity), as known in the art. As depicted in FIGS. 1A and 1B, imager arrays 204 of image sensors 200 are non-symmetrically placed on the active surface, in this instance by way of non-limiting example only, toward the upper left-hand (as the drawing sheet is oriented) quadrant of each image sensor 200. In other words, the imager arrays 204 lie closer to one or more sides (in this instance, to the uppermost and left-hand sides) of the image sensors 200 than to at least one other side. The center C of each imager array 204 is, thus, also non-symmetrically placed, or "off-center" with respect to the geometric center of image sensor 200 bearing that imager array 204. Streets 206 (shown of exaggerated width for clarity) which laterally space image sensors 200 and along which image sensors 200 may be singulated from each other and from bulk semiconductor substrate 100, lie between the imager sensors 200.

As shown in FIGS. 1A and 1B, according to an embodiment of the invention, a lens array 300 comprising a plurality of lenses 302 positioned over image sensors 200 with the optical center OC of each lens 302, which may also be termed the "optical axis" thereof, aligned with the center C of an associated imager array 204, rather than with the geometric center of an image sensor 200. The lens array 300 may comprise a bulk or wafer-level substrate in the form of a "lens wafer" including a plurality of lenses 302 laterally joined by a linkage material 304, which may comprise a substrate aligned with streets 206, as will be hereinafter described or, in some embodiments, may comprise an intermediate portion extending from each lens 302 laterally to join each lens to the linkage material 304 of the substrate. As can be seen in FIGS. 1A and 1B, certain edges 306 of lenses 302 adjacent to streets 206 are truncated or cropped at a peripheral side of the lens 302 coincident with a peripheral side or lateral edge of the associated image sensor 200 to accommodate the non-symmetrical lens placement of with the optical center OC of each lens 302 over the center C of each associated imager array 204. Truncated edges 306 are not part of the optical path focusing on the associated imager array 204.

Figure 2A:
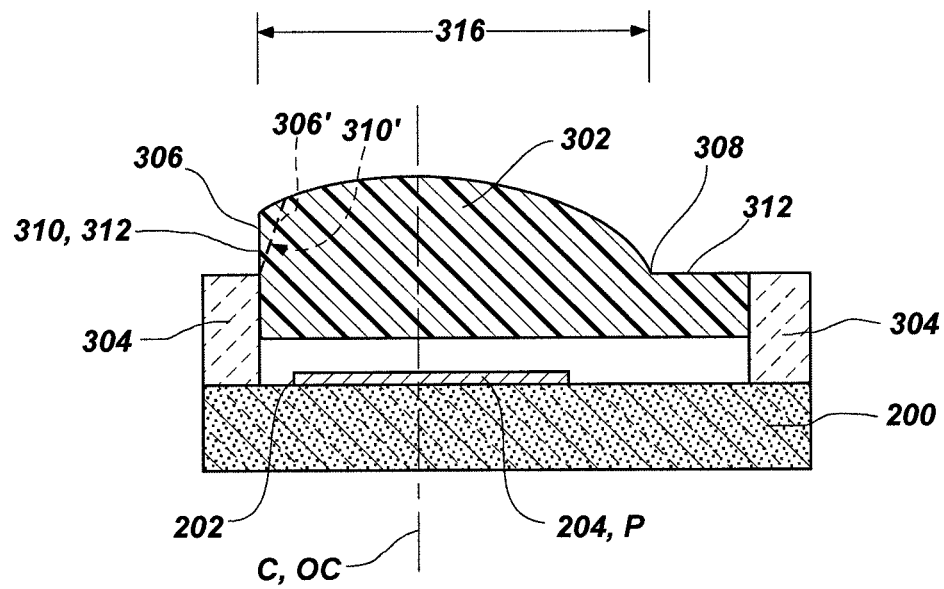
FIG. 2A is an enlarged, schematic side sectional elevation of an embodiment of one of the image sensors of FIGS. 1A and 1B after singulation from the bulk semiconductor substrate.

FIG. 2A depicts an embodiment of a single image sensor 200 with superimposed lens 302 after singulation from bulk semiconductor substrate 100 through linkage material 304 and the material of bulk semiconductor substrate 100 along streets 206 (see FIGS. 1A and 1B) by conventional techniques. As may readily be seen, truncated, abbreviated lens edges 306 of the lenses 302 are significantly thicker than non-truncated edge 308, and may present flat, vertical (as the drawing figure is oriented) surfaces 310. However, in embodiments of the invention, surfaces 310 of truncated lens edges 306 may not be flat, or vertical. For example, as depicted in broken lines in FIG. 2A, a truncated lens edge 306' may comprise a flat surface 310' disposed at an acute angle (exaggerated in FIG. 2A) to the vertical, that is to say the optical axis of lens 302. Such an edge orientation may, for example, facilitate release of lens 302 from a mold used to form the lens 302, as discussed below. As another alternative, depicted in broken lines in FIG. 2B, a truncated lens edge 306" may be arcuate and present a curved surface 310" having a radius of curvature or other curved configuration different than the curvature of the adjacent surface S of lens 302.

As shown in FIG. 2A, to avoid reflections of radiation passing through each lens 302, at least surfaces 310 of truncated edges 306 may be covered with an opaque, non-reflective material 312, such as a metal, or a polymer containing carbon black. If desired, the opaque material 312 may be blanket-deposited and then patterned by conventional techniques so as to remove all but the portion thereof coating the surfaces 310 or patterned only on the upper surface of an otherwise light-transmissive lens material from which lens 302 is formed and which extends laterally to the linkage material 304 of the substrate to define an aperture 316 over the imager array 204 free from the opaque, non-reflective material 312 on that surface of the lens element 302 generally in the plane thereof and adjacent lens 302 to further limit passage of light through lens element 302. The opaque, non-reflective material 312 may be applied by conventional techniques, such as for example chemical vapor deposition (CVD) in the case of a metal, and spray or spin-coating in the case of a carbon black-filled polymer.

Figure 2B:
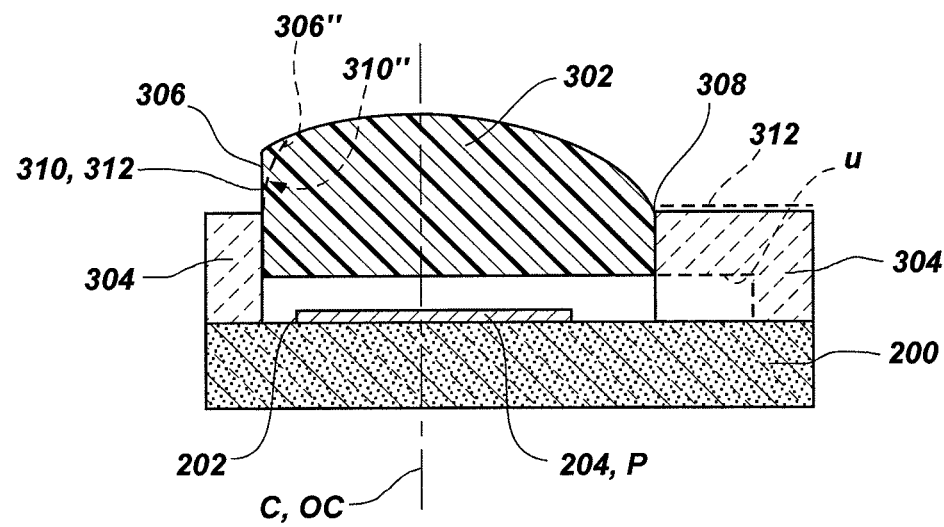
FIG. 2B is an enlarged, schematic side sectional elevation of another embodiment of one of the image sensors of FIGS. 1A and 1B after singulation from the bulk semiconductor substrate.

FIG. 2B depicts another embodiment of a single image sensor 200 with superimposed lens 302 after singulation from bulk semiconductor substrate 100 through linkage material 304 and the material of bulk semiconductor substrate 100 along streets 206 (see FIGS. 1A and 1B) by conventional techniques. Truncated lens edges 306 of the lenses 302 are significantly thicker than non-truncated edge 308, and may present flat, vertical (as the drawing figure is oriented) surfaces 310. As previously referenced and depicted in broken lines in FIG. 2B, a truncated lens edge 306" may be arcuate and present a curved surface 310 having a radius of curvature or other curved configuration different than the curvature of the adjacent surface S of lens 302.

As shown in FIG. 2B, to avoid reflections of radiation passing through each lens 302, at least surfaces 310 of truncated edges 306 may be covered with an opaque, non-reflective material 312, such as a metal, or a material comprising carbon black (e.g., a polymer containing carbon black). If desired, the opaque material 312 may be blanket-deposited and then patterned by conventional techniques so as to remove all but the portion thereof coating the surfaces 306. In the embodiment of FIG. 2B, substrate 304 is formed to extend to the location of lens 302, wherein the via in which the lens 302 is located is sized and configured to define a periphery of the lens 302. As shown in broken lines at U, substrate 304 may be undercut in locations over the active surface of image sensor 200, either by a masking and etching operation or, in the case of a substrate formed by molding, by suitably configuring the mold. In such an instance, if the material of the substrate 302 is light-transmissive or to simplify the mask required in the patterning process for removal of opaque material 312, the opaque material 312 (shown in broken lines on the upper surface of substrate 304 adjacent lens 302) may be patterned to define an aperture similar to aperture 316 of FIG. 2A 316 over the imager array 204 free from the opaque, non-reflective material 312 on the surface of the lens 302 to further limit passage of light other than through lens 302.

Figure 3A:
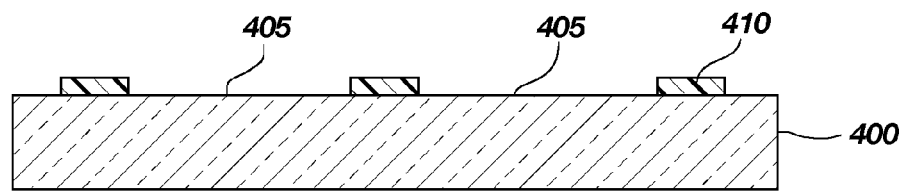
FIGS. 3A-3C depict acts in the fabrication of one embodiment of a lens of the present invention.
Figure 3B:
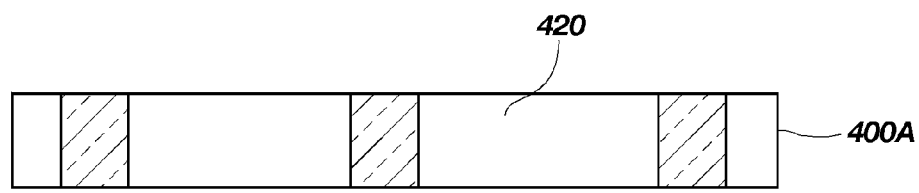
Figure 3C:
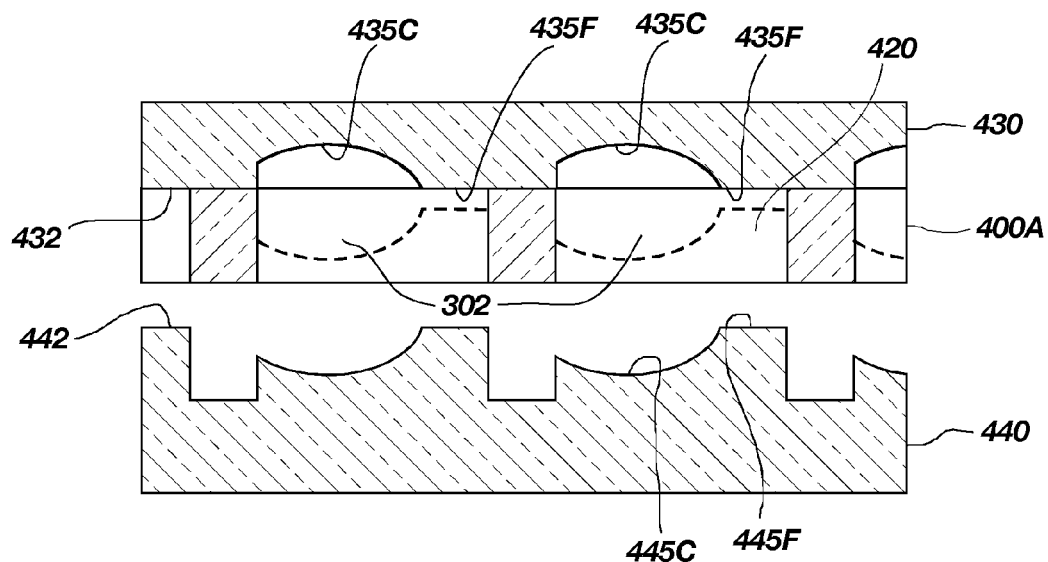

FIGS. 3A through 3C illustrate a method of forming a lens array at the wafer or other bulk substrate level. A substrate 400 is provided with patterned photoresist 410 thereon. The substrate 400 may be sized and shaped like a wafer for use in processing by existing semiconductor fabrication equipment. The substrate 400 may comprise, by way of example, a silicon or borosilicate material. As used herein, the term "wafer" encompasses conventional wafers, and other bulk semiconductor substrates such as silicon-on-insulator (SOI) substrates as exemplified by silicon-on-glass (SOG) substrates and silicon-on-sapphire (SOS) substrates, although the latter type of structures may be more difficult to employ due to their multi-layer nature. The substrate 400 may be, for example, a silicon wafer which has been determined to be unsuitable for its original purpose due to damage or defects therein. Thus, a recycled wafer may be used as the substrate 400.

The photoresist 410 may be patterned by known methods, for example, photolithographic methods of masking, patterning, developing and etching. Via locations 405 may be exposed on the substrate 400 through the patterned and developed photoresist 410. The substrate 400 may be substantially anisotropically etched by a wet (chemical) or dry (reactive ion etch, or "RIE") etch technique suitable for the material of substrate 400 to form vias 420 in the exposed via locations 405. With reference to FIGS. 2A and 2B, it should be noted that vias 420 may be sized to be larger than lenses 302 to be formed thereover, or to a size similar to that of the lenses. After etching, the photoresist 410 may be removed to form the substrate 400A having vias 420, as shown in FIG. 3B, extending therethrough. Other methods of forming vias 420, for example by laser ablation or mechanical drilling, or combinations of techniques, such as laser ablation followed by a chemical etch, are also within the scope of the invention. Alternatively, other materials may be employed for substrate 400, for example ceramics and plastics. With either of these materials, a substrate 400A with vias 420 therein, may be fabricated by conventional molding techniques.

Turning to FIG. 3C, first and second mold plates 430 and 440 for the fabrication of lenses 302 may be provided for placement on opposing sides of substrate 400A. The first mold plate 430 may include concave portions 435c and associated flat portions 435f at spaced apart locations on a surface 432 thereof. The concave portions 435c may be sized, configured and spaced within the vias 420 of the substrate 400A for placement over non-symmetrically located imager arrays 204 of image sensors 200 fabricated on a bulk semiconductor substrate 100 (see FIGS. 1A and 1B) and the associated flat portions 435f extend to inner peripheries of vias 420. The second mold plate 440 may also include, by way of example only, concave portions 445c and associated flat portions 445f at spaced apart locations on a surface 442 thereof. The concave portions 445c of second mold plate 440 may be sized, configured and spaced to align with the concave portions 435c of first mold plate 430 and be received within the vias 420 of the substrate 400A, the associated flat portions 435f and 445f extending to inner peripheries of vias 420. Of course, it is contemplated that second mold plate 440 may present a flat surface, so that lens 302 is domed on only one side, or a convex surface so that lens 302 is formed with a concave underside. Any suitable configuration for each side of a lens 302 may thus be achieved through the use of an appropriate, oppositely configured mold plate.

Lens material in a flowable or otherwise deformable state, for example, a polymer such as a polyimide, may be introduced into the vias 420 of the substrate 400A. A photopolymer curable, for example, by exposure to ultraviolet (UV) light may also be employed. The lenses 302 (and, if vias 420 are of a greater size than lenses 302, a supporting structure) may be formed, by example, by conventional injection molding or transfer molding techniques. A glass material, such as silicon dioxide, borosilicate glass, phosphosilicate glass, or borophosphosilicate glass, may also be used as a lens material and formed while in a flowable state, chemically etched to a desired configuration or both. The coefficient of thermal expansion (CTE) of the lens material may be selected to reasonably match that of the substrate. Thus, thermal mismatch problems at temperatures and over temperature ranges encountered in fabrication, test and use of the semiconductor packages may be avoided.

The first mold plate 430 and the second mold plate 440 may be aligned with the substrate 400A, and the lenses 302 (shown in broken lines in FIG. 3C) may be formed using injection or transfer molding, or embossing, or UV imprint lithography. In one embodiment, the first mold plate 430 may be aligned with the substrate 400A, and the vias 420 may be substantially filled with the lens material, the first mold plate 430 and substrate 400A being inverted from the position shown in FIG. 3C. The second mold plate 440 may then be pressed against the substrate 400A sandwiching the substrate 400A between the first mold plate 430 and the second mold plate 440 and pressing the flowable or deformable lens material into the concave portions 435c of the first mold plate 430 between the first mold plate 430 and the second mold plate 440. The mold plates 430, 440 may be used to form the lenses 302 from the lens material to their final shape in a stamping operation. The mold plates 430, 440 may comprise, for example, silicon.

A step and repeat method may be employed to individually form the lenses 302, or small groups of lenses 302. Polymer may be stamped and cured from one or both sides of the substrate 400A and the substrate 400A moved to the next lens element location for a stamp and cure. This method may be used to form an array of lenses 300 within the substrate 400A. A step and repeat method may reduce the cost of forming a full wafer mold, and smaller, high accuracy molds are easier to make.

Figure 4:
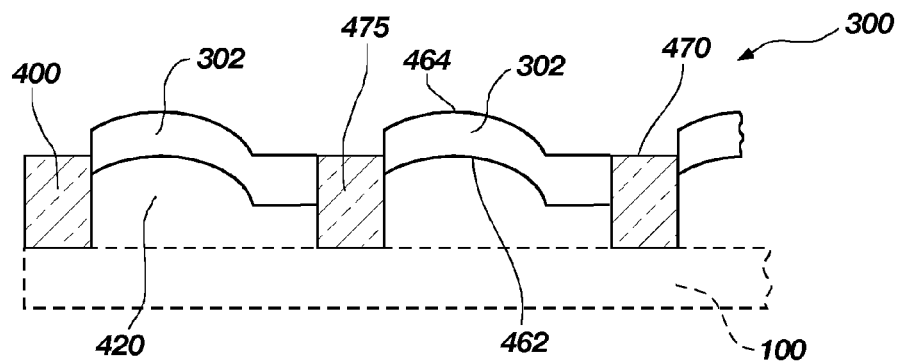
FIG. 4 shows one embodiment of a wafer level lens array of the present invention.

The lens material within the vias 420 of the substrate 400A and the concave portions 435c of the first mold plate 430 may be solidified, for example by applying one or more of pressure, light, heat, vacuum or cooling, depending upon the lens material selected to form a plurality of lenses 302, each positioned in a via 420 of the substrate 400A. FIG. 4 depicts a portion of wafer-level lens array 300 with lenses 302 in a lens array substrate 470. The lens array substrate 470 may be formed using the method described to form the substrate 400A of FIG. 3B, and may be configured to have a size and peripheral shape corresponding to the diameter of a wafer used with conventional semiconductor fabrication equipment.

In short, lenses 302 may be fabricated using one of a wide variety of suitable techniques, such as from a polymer or a glass material, and by molding, pressing or stamping such material in a flowable or otherwise deformable state. Further, lenses 302 may be formed from a glass plate by putting an image (domed surface shape, either concave or convex or other, more complex desired shape) of the lens 302 in a polymer and using the polymer as a pattern to etch the glass to the desired shape. In such an instance, the substrate or linkage material of the wafer-level lens array may comprise the same material as that of the lenses supported thereby. The fabrication technique employed is, thus, a matter of choice based on the material chosen for the lens in question.

It may be desirable to form a lens element in an asymmetric (with respect to the major plane of the lens) shape to enable a lens configuration having a desired focal length. The lenses 302 of the wafer-level lens array 300 shown in FIG. 4 are asymmetric, with a convex surface 464 and an opposing, concave surface 462. It also may be desirable to form a double concave or double convex lens that may or may not have symmetrical profiles. The lens profile, whether concave or convex spherical or aspherical, will depend on the optical design and the optical performance requirements of the lens system.

The substrate 400A of wafer-level lens array 300 may be bonded, by way of example only, to bulk semiconductor substrate 100 as shown in broken lines in FIG. 4 in the form an imager wafer as is known to those of ordinary skill in the art. Suitable bonding techniques are described below and may vary depending upon the material employed for substrate 400A. The imager wafer may include an array of semiconductor dice in the form of image sensor dice or other optically active dice comprising image sensors 200, the term "optically active" encompassing any semiconductor die which is configured to sense or emit electromagnetic radiation. For example, the image sensors 200 may comprise CMOS imagers, each having an optically sensitive circuit, which may be characterized as an optically active region or imaging area 202 comprising an imager array 204.

An imager wafer may further conventionally include external electrical connection elements in the form of conductive vias therethrough, circuit traces and terminal pads or lands thereon, or combinations thereof, for connecting the optically sensitive circuit comprising imager array 204 of each image sensor 200 with external circuitry. The configuration employed for effecting external connections of an image sensor may be selected as desire. The external electrical connection elements may, optionally, be spaced to align with the substrate material of a lens array substrate 470 but in any case are located outside the "street" lines 206 defined between individual image sensors 200 (see FIGS. 1A and 1B) and along which the imager wafer is singulated.

The imager wafer may comprise silicon. The lens array substrate 470 may, as noted above, comprise borosilicate, which has a coefficient of thermal expansion (CTE) close to the CTE of silicon, reducing problems associated with CTE mismatch. Use of a lens array substrate 470 comprising a semiconductor material or other material (for example, a ceramic) of similar CTE provides a CTE, close, if not identical to, that of the semiconductor material of the imager wafer, avoiding the severe mismatch of CTEs which occurs when a metal lens frame is employed, and associated stress on the assembly during thermal cycling experienced in normal operation of a image sensor device assembly.

The lens array substrate 470 may be bonded to the imager wafer by any suitable method, for example, fusion bonding, anodic bonding, or with an epoxy. Anodic bonding and fusion bonding are described in A. Berthold, et al., *Low Temperature Wafer-To-Wafer Bonding for MEMS Applications*, Proc. RISC/IEEE, 31-33, 1998 (ISBN 90-73461-15-4), the disclosure of which is incorporated by reference herein. Anodic bonding may be used to join silicon-to-silicon, silicon-to-glass and glass-to-glass, wherein a high voltage (800V) electric field induces adhesion at about 300° C. Alternatively, a lower temperature fusion bonding method may be used, including a first surface etching step, rinse, nitric acid treatment, rinse, prebonding of the components under force, and annealing at a somewhat elevated (120° C.) but generally lower temperature than is employed for anodic bonding. Epoxy may be applied by screen printing, dispensing or pad printing methods. Spacer beads can be added to the epoxy to help accurately define the bondline gap and maintain uniformity across the wafer.

Processing the lenses 302 at a wafer level enables the wafer-level lens array 300 to be precisely aligned over a bulk semiconductor substrate 100 in the form of an imager wafer having an array of image sensors 200 fabricated thereon. Because the entire wafer-level lens array 300 and array of image sensors 200 on bulk semiconductor substrate 100 are aligned together, the alignment may be made more precise than aligning each lens 302 and image sensor individually. The wafer-level lens array 300 and the imager wafer may both be fabricated and bonded together in the same clean room environment, which may reduce the incidence of particulate matter introduction between each lens and its associated image sensor 200. Multiple wafer-level lens arrays 300 may be stacked over a single imager wafer. A stack of lenses may be necessary for optimal image projection on an image sensor device.

The imager wafer may be singulated between image sensors 200 to form image sensor packages, as previously noted. The substrate material 475 of the lens array substrate 470 of wafer-level lens array 300 may be cut between the lenses 302 in a singulation act to produce a plurality of image sensor packages from the lens array substrate 470 and the imager wafer. Each image sensor package may include a portion of the substrate 470, surrounding the lens element 302. The term "cutting" is used when referring to singulation as such may be conventionally effected by using, for example, a wafer saw, but will be understood to include mechanical or water sawing, etching, laser cutting or other method suitable for severing the substrate material 475 of the lens array substrate 470 and the imager wafer.

Alternatively, the lens array substrate 470, or a stack thereof, may be singulated or diced for single die placement on a wafer or other bulk semiconductor substrate. One advantage of this method is that only known good image sensors 200, having been previously tested, need be provided with a lens 302.

The concave surface 462 of the lens element 302 may be oriented to face the imager wafer and provide a cavity or chamber comprising an air, gas, or a vacuum gap between the concave lens surface 462 and the image sensor 200. Any suitable material with a refractive index less than that of the lens material may be employed for filling the cavity. The lens 302 may be sized, shaped, and otherwise configured to focus and/or collimate radiation (e.g., visible light) onto the optically active region of the image sensor 200. It should be noted that the present invention may be practiced, in some embodiments, through the disposition of a non-symmetrically placed lens 302 over a back surface of a bulk semiconductor substrate 100 bearing an imager array 204 when the substrate 100 has been sufficiently thinned to permit light transmission therethrough to the pixels P of the imager array 204, such structures being known in the art.

The image sensor packages may each include a plurality of external electrical conductors, as is known in the art. The external electrical conductors may comprise discrete conductive elements in the form of conductive bumps, balls, studs, columns, pillars or lands. For example, solder balls may be formed or applied as external electrical conductors, or conductive or conductor-filled epoxy elements. The external electrical conductors may be in communication with the imaging area 202 of image sensor 200 through conductive vias, conductive traces, or both, as noted above. For example, an imager wafer may include a redistribution layer (RDL) of circuit traces on the back side surface thereof in communication with conductive vias extending therethrough. In another approach, external electrical conductors may be formed or disposed directly over conductive vias. In yet another approach, no external electrical conductors are employed, and conductive vias or traces of an RDL may be placed in direct contact with conductors of higher-level packaging. Thus, electrical signals may be transferred between the optically sensitive region of each image sensor 200 and external components (not shown). Any arrangement of suitable external electrical connectors may be electrically connected to the image sensor 200 to provide a particular package configuration, including a hall-grid array (BGA), a land grid array (LGA), a leadless chip carrier (LCC), a quad flat pack (QFP), quad flat no-lead (QFN) or other package type known in the art.

In some embodiments of image sensor packages of the present invention, the imager sensor package may include a lens stack comprising a plurality of lenses or lens arrays stacked one over another so as to form a stack of lenses that collimates and/or focuses radiation onto the optically active region of the image sensor 200 as necessary or desired. In other embodiments, the imager sensor package may include microlenses as well as a cover glass, a relatively larger lens, a field flattening lens, or a stack of various combinations of. A lens stack with only two lenses, for example a microlens array and a relatively larger lens is within the scope of the present invention.

Further detail regarding fabrication of image sensor packages, lenses and lens stacks therefore is disclosed in U.S. patent application Ser. No. 11/751,206, filed May 21, 2007, and in U.S. patent application Ser. No. 11/732,691, filed Apr. 4, 2007, each such application assigned to the assignee of the present invention and the disclosure of each of which is hereby incorporated in its entirety by reference herein.

Figure 5:
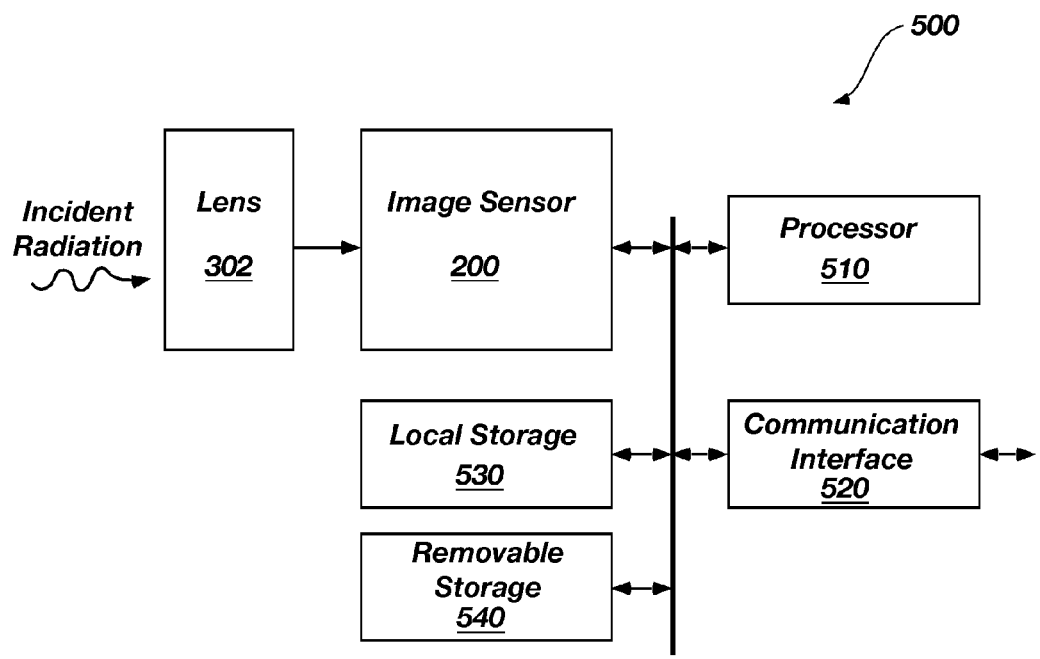
FIG. 5 is a simplified block diagram illustrating an embodiment of an imaging system that includes a lens as shown and described with respect to FIGS. 1-4.

FIG. 5 is a simplified block diagram illustrating one embodiment of an imaging system 500 according to the present invention. In some embodiments, the imaging system 500 may comprise, for example, a digital camera, a cellular telephone, a computer, a personal digital assistant (PDA), home security system sensors, scientific testing devices, or any other device or system capable of capturing an electronic representation of an image. The imaging system includes at least one image sensor 200 having a non-symmetrically located imaging area 202 (see FIG. 1A) and a non-symmetrically located lens 302 or a stack of lenses comprising two or more superimposed, non-symmetrically located lenses 302 according to various embodiments of the present invention. The imaging system 500 may include an electronic signal processor 510 for receiving electronic representations of images from the image sensor 200 and communicating the images to other components of the imaging system 500. The imaging system 500 also may include a communication interface 520 for transmitting and receiving data and control information. In some embodiments, the imaging system 500 also may include one or more memory devices. By way of example and not limitation, the imaging system may include a local storage device 530 (e.g., a read-only memory (ROM) device and/or a random access memory (RAM) device) and a removable storage device 540 (e.g., flash memory).

Embodiments of the present invention enable the imager circuit designer to optimize the imager layout without being as concerned with the center of the imager array being close to the center of the image sensor. Embodiments of the present invention also enable the fabrication and use of a thick, low sag lens without concerns that the lens boundary might encroach on a neighboring image sensor, prior to singulation of the joined wafer-level image sensor and lens element assemblies.

Although the foregoing description contains many specifics, these should not be construed as limiting the scope of the present invention, but merely as providing illustrations of some embodiments. Similarly, other embodiments of the invention may be devised which do not depart from the scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for forming an image sensor package, comprising:
    providing a lens comprising at least one abbreviated side, wherein the at least one abbreviated side renders a periphery of the lens non-circular when the lens is viewed from a top-down perspective; and
    supporting the lens over a via extending through a substrate, the via being disposed over an imager array non-symmetrically located on an image sensor die, with the lens in optical alignment with the imager array.

2. The method of claim 1, further comprising placing the at least one abbreviated side in substantial alignment with a lateral edge of the image sensor die.

3. The method of claim 1, further comprising rendering the at least one abbreviated side opaque and non-reflective.

4. The method of claim 3, wherein rendering the at least one abbreviated side opaque and non-reflective comprises coating the at least one abbreviated side with a metal or a material, the material comprising carbon black.

5. The method of claim 3, further comprising rendering at least a portion of a structure supporting the lens laterally adjacent thereto opaque and non-reflective.

6. The method of claim 2, wherein forming the lens with the at least one abbreviated side comprises forming the lens with two adjacent ones of the at least one abbreviated side and placing the two adjacent ones of the at least one abbreviated side in substantial alignment with two corresponding adjacent sides of the image sensor die.

7. The method of claim 1, further comprising aligning an optical center of the lens with a center of the imager array.

8. The method of claim 1, further comprising:

fabricating the image sensor die as part of a wafer-level array of image sensor dice, each having a substantially identically non-symmetrically located imager array on the image sensor die; and fabricating the lens as part of a wafer-level array of lenses respectively extending over corresponding vias of the substrate, each lens located for optical alignment with the imager array upon superimposition of the wafer-level array of image sensors sensor dice with the wafer-level array of lenses.

9. The method of claim 8, further comprising securing the wafer-level array of lenses to the wafer-level array of image sensors sensor dice with material of the substrate in substantial alignment with streets located between adjacent ones of the wafer-level array of image sensor dice.

10. The method of claim 9, further comprising singulating each image sensor die with the lens affixed thereto along the streets.

11. The method of claim 10, further comprising singulating each lens from the wafer-level array of lenses with a surrounding frame of the material of the substrate of the wafer-level array of lenses.

12. An image sensor package, comprising:
an image sensor having an off-center optically sensitive region comprising an array of optically sensitive pixels;
a substrate having a via therethrough, wherein the via is disposed over the optically sensitive region; and
a lens supported over the via and aligned with the off-center optically sensitive region, wherein the lens comprises at least one truncated side, and the at least one truncated side renders a periphery of the lens non-circular when the lens is viewed from a top-down perspective.

13. The image sensor package of claim 12, wherein the at least one truncated side of the lens is significantly thicker than at least one non-truncated side of the lens.

14. The image sensor package of claim 12, wherein the at least one truncated side of the lens is opaque and non-reflective.

15. The image sensor package of claim 14, wherein the at least one truncated side of the lens comprises a coating of a metal or a material, the material comprising carbon black, disposed on the at least one truncated side.

16. The image sensor package of claim 14, wherein the at least one truncated side of the lens comprises two adjacent truncated sides.

17. The image sensor package of claim 14, wherein at least a portion of a surface of a structure supporting the lens on the substrate and adjacent the lens is opaque and non-reflective.

18. The image sensor package of claim 12, wherein the image sensor comprises one of a complementary metal oxide semiconductor (CMOS) imager and a charge-coupling device (CCD) imager.

19. The image sensor package of claim 12, wherein the substrate and the lens are disposed over a surface of the image sensor, the surface of the image sensor having the optically sensitive region located thereon.

20. The image sensor package of claim 12, wherein an optical center of the lens is aligned with a center of the optically sensitive region.

21. A wafer-level imager assembly, comprising:

a wafer-level semiconductor substrate comprising an array of image sensors, each image sensor including a non-symmetrically located imager array;

a wafer-level substrate comprising an array of vias, at least some of the array of vias disposed over a corresponding one of the array of image sensors; and an array of lens elements supported over the array of vias, each lens element comprising a lens having an optical center aligned with a center of the imager array, wherein each lens comprises at least one truncated side, wherein the at least one truncated side renders a periphery of the lens non-circular when the lens is viewed from a top-down perspective.

22. The wafer-level imager assembly of claim 21, wherein each lens further comprises at least one non-truncated side and the at least one truncated side, and the at least one non-truncated side comprises a non-symmetrical periphery.

23. The wafer-level imager assembly of claim 22, wherein the at least one truncated side is thicker than the at least one non-truncated side.

24. The wafer-level imager assembly of claim 21, wherein the at least one truncated side comprises an opaque and non-reflective surface.

25. An imaging system, comprising:
an image sensor package, comprising:
a semiconductor die bearing an optically sensitive region non-symmetrically positioned on a major surface thereof, the optically sensitive region comprising an array of optically sensitive pixels;
a substrate having a via therethrough, wherein the via is located over at least the optically sensitive region; and
a lens element over the via and comprising a lens in alignment with the optically sensitive region of the semiconductor die, wherein the lens comprises at least one truncated side, wherein the at least one truncated side renders a periphery of the lens non-circular when the lens is viewed from a top-down perspective;
an electronic signal processor in communication with the image sensor package;
a communication interface in communication with the electronic signal processor; and
a local storage device in communication with the electronic signal processor.

26. The imaging system of claim 25, wherein the imaging system comprises one of a digital camera, camera (cell) phone, personal digital assistants (PDA), home security system, endoscope, optical storage apparatus and scientific testing apparatus.

27. The imaging system of claim 25, wherein the semiconductor die comprises one of a complementary metal oxide semiconductor (CMOS) imager and a charge-coupling device (CCD) imager.

28. The imaging system of claim 25, wherein the lens further comprises at least one non-truncated side and wherein the at least one truncated side and the at least one non-truncated side comprise a non-symmetrical periphery.

29. The imaging system of claim 25, wherein an optical center of the lens is aligned with a center of the optically sensitive region.

* * * * *

UNITED STATES PATENT AND TRADEMARK OFFICE
CERTIFICATE OF CORRECTION

PATENT NO. : 9,153,614 B2  
APPLICATION NO. : 11/839377  
DATED : October 6, 2015  
INVENTOR(S) : Mark E. Tuttle It is certified that error appears in the above-identified patent and that said Letters Patent is hereby corrected as shown below:

In the specification:

| | | |
|---|---|---|
| COLUMN 5, | LINE 5, | change "surfaces 306." to --surfaces 310.-- |
| COLUMN 5, | LINE 6, | change "substrate 304" to --the linkage material 304 of the substrate-- |
| COLUMN 5, | LINE 9, | change "substrate 304" to --the linkage material 304 of the substrate-- |
| COLUMN 5, | LINE 17, | change "substrate 304" to --the linkage material 304 of the substrate-- |
| COLUMN 5, | LINE 19, | change "2A 316" to --2A-- |

Signed and Sealed this  
Twelfth Day of April, 2016

Michelle K. Lee  
*Director of the United States Patent and Trademark Office*